United States Patent
Li et al.

(10) Patent No.: US 11,640,967 B2
(45) Date of Patent: May 2, 2023

(54) MICRO LIGHT-EMITTING DEVICE DISPLAY APPARATUS

(71) Applicant: PlayNitride Display Co., Ltd., MiaoLi County (TW)

(72) Inventors: Yu-Chu Li, MiaoLi County (TW); Yi-Ching Chen, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 220 days.

(21) Appl. No.: 17/128,226

(22) Filed: Dec. 21, 2020

(65) Prior Publication Data

US 2021/0327955 A1 Oct. 21, 2021

(30) Foreign Application Priority Data

Apr. 20, 2020 (TW) .................................. 109113122

(51) Int. Cl.
*H01L 27/15* (2006.01)
*H01L 33/62* (2010.01)
(Continued)

(52) U.S. Cl.
CPC .............. *H01L 27/156* (2013.01); *G09G 3/32* (2013.01); *H01L 33/22* (2013.01); *H01L 33/24* (2013.01);
(Continued)

(58) Field of Classification Search
None
See application file for complete search history.

(56) References Cited

U.S. PATENT DOCUMENTS

2015/0092092 A1 4/2015 Okigawa
2019/0157339 A1* 5/2019 Brick ...................... H01L 33/62
(Continued)

FOREIGN PATENT DOCUMENTS

CN 102956195 3/2013
CN 105144387 12/2015
(Continued)

OTHER PUBLICATIONS

Office Action of Taiwan Counterpart Application, dated Apr. 15, 2021, pp. 1-3.
(Continued)

*Primary Examiner* — Robert K Carpenter
(74) *Attorney, Agent, or Firm* — JCIPRNET (57) ABSTRACT

A micro light-emitting device display apparatus includes a driving substrate and a plurality of micro light-emitting devices. The micro light-emitting devices are disposed on the driving substrate. The micro light-emitting devices include a plurality of first, second and third micro light-emitting devices. Each of the first, the second and the third micro light-emitting devices respectively has a plurality of first, second, and third light-emitting regions independently controlled. A first light-emitting region of a first micro light-emitting device, a second light-emitting region of a second micro light-emitting device, and a third light-emitting region of a third micro light-emitting device are located in a first pixel region. A first light-emitting region of another first micro light-emitting device, a second light-emitting region of another second micro light-emitting device, and another third light-emitting region of the third micro light-emitting device are located in a second pixel region.

19 Claims, 8 Drawing Sheets

(51) Int. Cl.
  *H01L 33/24* (2010.01)
  *H01L 33/22* (2010.01)
  *H01L 33/38* (2010.01)
  *H01L 33/60* (2010.01)
  *G09G 3/32* (2016.01)

(52) U.S. Cl.
  CPC ............ *H01L 33/382* (2013.01); *H01L 33/60* (2013.01); *H01L 33/62* (2013.01)

(56) References Cited

U.S. PATENT DOCUMENTS

| | | |
|---|---|---|
| 2019/0229235 A1 | 7/2019 | Iguchi |
| 2019/0237518 A1 | 8/2019 | Sun et al. |

FOREIGN PATENT DOCUMENTS

| | | | |
|---|---|---|---|
| CN | 107248522 | 10/2017 | |
| CN | 107275359 | 10/2017 | |
| CN | 107305905 | 10/2017 | |
| CN | 108288661 | 7/2018 | |
| CN | 108538245 | 9/2018 | |
| CN | 109244204 | 1/2019 | |
| CN | 109389910 | 2/2019 | |
| CN | 110224016 | 9/2019 | |
| CN | 110998852 | 4/2020 | |
| CN | 113764495 A * | 12/2021 | |
| JP | 2005129505 | 5/2005 | |
| TW | 201921668 | 6/2019 | |
| TW | I682530 | 1/2020 | |
| WO | WO-2016016461 A1 * | 2/2016 | ......... H01L 25/0753 |
| WO | WO-2016062835 A1 * | 4/2016 | ........... G09G 3/2088 |

OTHER PUBLICATIONS

"Notice of allowance of China Counterpart Application", dated Apr. 13, 2022, p. 1-p. 7.

* cited by examiner

MICRO LIGHT-EMITTING DEVICE DISPLAY APPARATUS

CROSS-REFERENCE TO RELATED APPLICATION

This application claims the priority benefit of Taiwan application serial no. 109113122, filed on Apr. 20, 2020. The entirety of the above-mentioned patent application is hereby incorporated by reference herein and made a part of this specification.

BACKGROUND OF THE INVENTION

1. Field of the Invention

The invention relates to a display apparatus, and more particularly, to a micro light-emitting device display apparatus.

2. Description of Related Art

With the advancement of photoelectric technologies, the volume of many photoelectric components is gradually becoming smaller. In recent years, due to the breakthroughs in the manufacturing size of a light-emitting diode (LED), micro-LED displays that are manufactured in an array of LEDs are gradually gaining attention in the market currently. In order to improve the display quality, the resolution of the displays is increasing. However, high resolution means that a larger number of micro-LEDs are required to be transferred from a carrier substrate to a receiving substrate. Consequently, the transfer process is also likely to cause a decrease in yield, and it is easy to increase manufacturing costs.

SUMMARY OF THE INVENTION

The invention provides a micro light-emitting device display apparatus, in which a micro light-emitting device can be located in a plurality of pixel regions, which can reduce the number of micro light-emitting devices used to reduce the number of transfer times and reduce production costs.

The micro light-emitting device display apparatus of the invention includes a driving substrate and a plurality of micro light-emitting devices. The driving substrate has a plurality of pixel regions. The pixel regions are divided into at least one first pixel region and at least one second pixel region adjacent to each other on a vertical axis. The micro light-emitting devices are disposed on the driving substrate and electrically connected to the driving substrate. The micro light-emitting devices include a plurality of first micro light-emitting devices, a plurality of second micro light-emitting devices, and a plurality of third micro light-emitting devices. Each of the first micro light-emitting devices is bonded to the driving substrate and has a plurality of first light-emitting regions independently controlled. Each of the second micro light-emitting devices is bonded to the driving substrate and has a plurality of second light-emitting regions independently controlled. Each of the third micro light-emitting devices is bonded to the driving substrate and has a plurality of third light-emitting regions independently controlled. A first light-emitting region of a first micro light-emitting device, a second light-emitting region of a second micro light-emitting device, and a third light-emitting region of a third micro light-emitting device are located in the first pixel region. A first light-emitting region of another first micro light-emitting device, a second light-emitting region of another second micro light-emitting device, and another third light-emitting region of the third micro light-emitting device are located in the second pixel region.

In an embodiment of the invention, the number of the first micro light-emitting devices, the number of the second micro light-emitting devices, and the number of the third micro light-emitting devices are less than the number of the pixel regions, respectively.

In an embodiment of the invention, each of the first micro light-emitting devices emits a blue light, each of the second micro light-emitting devices emits a green light, and each of the third micro light-emitting devices emits a red light. An area of each of the third light-emitting regions is greater than an area of each of the first light-emitting regions and an area of each of the second light-emitting regions.

In an embodiment of the invention, the first micro light-emitting devices and the second micro light-emitting devices are arranged in a staggered manner on a horizontal axis.

In an embodiment of the invention, in each of the pixel regions, one of the first light-emitting regions of each of the first micro light-emitting devices and one of the second light-emitting regions of each of the second micro light-emitting devices are located at two ends of the same side of each of the pixel regions respectively. One of the third light-emitting regions of each of the third micro light-emitting devices is located in the center of another side opposite to the side.

In an embodiment of the invention, the first light-emitting regions of each of the first micro light-emitting devices are located in four pixel regions respectively. The second light-emitting regions of each of the second micro light-emitting devices are located in four pixel regions. The third light-emitting regions of each of the third micro light-emitting devices are located in two pixel regions.

In an embodiment of the invention, in each of the pixel regions, one of the first light-emitting regions of each of the first micro light-emitting devices and one of the second light-emitting regions of each of the second micro light-emitting devices are located at two ends of the same side of each of the pixel regions respectively. One of the third light-emitting regions of each of the third micro light-emitting devices is located at an end of another side opposite to the side. The first micro light-emitting devices and the third micro light-emitting devices are arranged in a staggered manner on the vertical axis.

In an embodiment of the invention, the first light-emitting regions of each of the first micro light-emitting devices are located in four pixel regions respectively. The second light-emitting regions of each of the second micro light-emitting devices are located in four pixel regions. The third light-emitting regions of each of the third micro light-emitting devices are located in four pixel regions.

In an embodiment of the invention, each of the micro light-emitting devices includes an epitaxial structure layer, a first electrode, and a plurality of second electrodes. The epitaxial structure layer includes a first type semiconductor layer, a plurality of second type semiconductor layers spaced apart, and a plurality of light-emitting layers spaced apart and connected to the first type semiconductor layer. The light-emitting layers are located between the first type semiconductor layer and the second type semiconductor layers. The first electrode is electrically connected to the first type semiconductor layer. The second electrodes are spaced apart and are electrically connected to the second type semiconductor layers.

In an embodiment of the invention, the first electrode and the second electrodes are located on two opposite sides of the epitaxial structure layer respectively.

In an embodiment of the invention, the first electrode and the second electrodes are located on the same side of the epitaxial structure layer. The epitaxial structure layer has a trench, and the trench separates the light-emitting layers and the second type semiconductor layers. The first electrode is electrically connected to the first type semiconductor layer through the trench.

In an embodiment of the invention, the micro light-emitting device display apparatus further includes a light guide plate, disposed on a side of the epitaxial structure layer relatively far away from the first electrode and the second electrodes.

In an embodiment of the invention, each of the micro light-emitting devices further includes a light barrier layer located between the first electrode and the light-emitting layers and between the first electrode and the second type semiconductor layers.

In an embodiment of the invention, the micro light-emitting device display apparatus further includes a plurality of reflective layers, disposed in the light guide plate, and corresponding to the micro light-emitting devices.

In an embodiment of the invention, each of the micro light-emitting devices includes an insulating layer, located between the first electrode and the light-emitting layers and between the first electrode and the second type semiconductor layers to electrically insulate the first electrode and the light-emitting layers, to electrically insulate the first electrode and the second type semiconductor layers.

In an embodiment of the invention, the micro light-emitting devices are located between the light guide plate and the driving substrate.

In an embodiment of the invention, the driving substrate is located between the micro light-emitting devices and the light guide plate.

In an embodiment of the invention, the light guide plate has a plurality of dot patterns. A density of the dot patterns gradually decreases in a direction from being far away from the micro light-emitting devices to being close to the micro light-emitting devices.

In an embodiment of the invention, a diameter of the dot patterns gradually decreases in the direction from being far away from the micro light-emitting devices to being close to the micro light-emitting devices.

In an embodiment of the invention, each of the dot patterns includes a groove pattern, an oblique concave pattern, or a combination of the above patterns.

Based on the foregoing, in the design of the micro light-emitting device display apparatus of the invention, a first light-emitting region of a first micro light-emitting device, a second light-emitting region of a second micro light-emitting device, and a third light-emitting region of a third micro light-emitting device are located in a first pixel region. A first light-emitting region of another first micro light-emitting device, a second light-emitting region of another second micro light-emitting device, and another third light-emitting region of the third micro light-emitting device are located in a second pixel region adjacent to the first pixel region. That is to say, a micro light-emitting device is located in a plurality of pixel regions, so that the number of micro light-emitting devices used can be reduced, and the production cost can be effectively reduced. In addition, since the present invention uses a micro light-emitting device as a light-emitting source, the micro light-emitting device display apparatus of the invention can achieve the effects of high resolution, reduced display power consumption, and energy saving.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
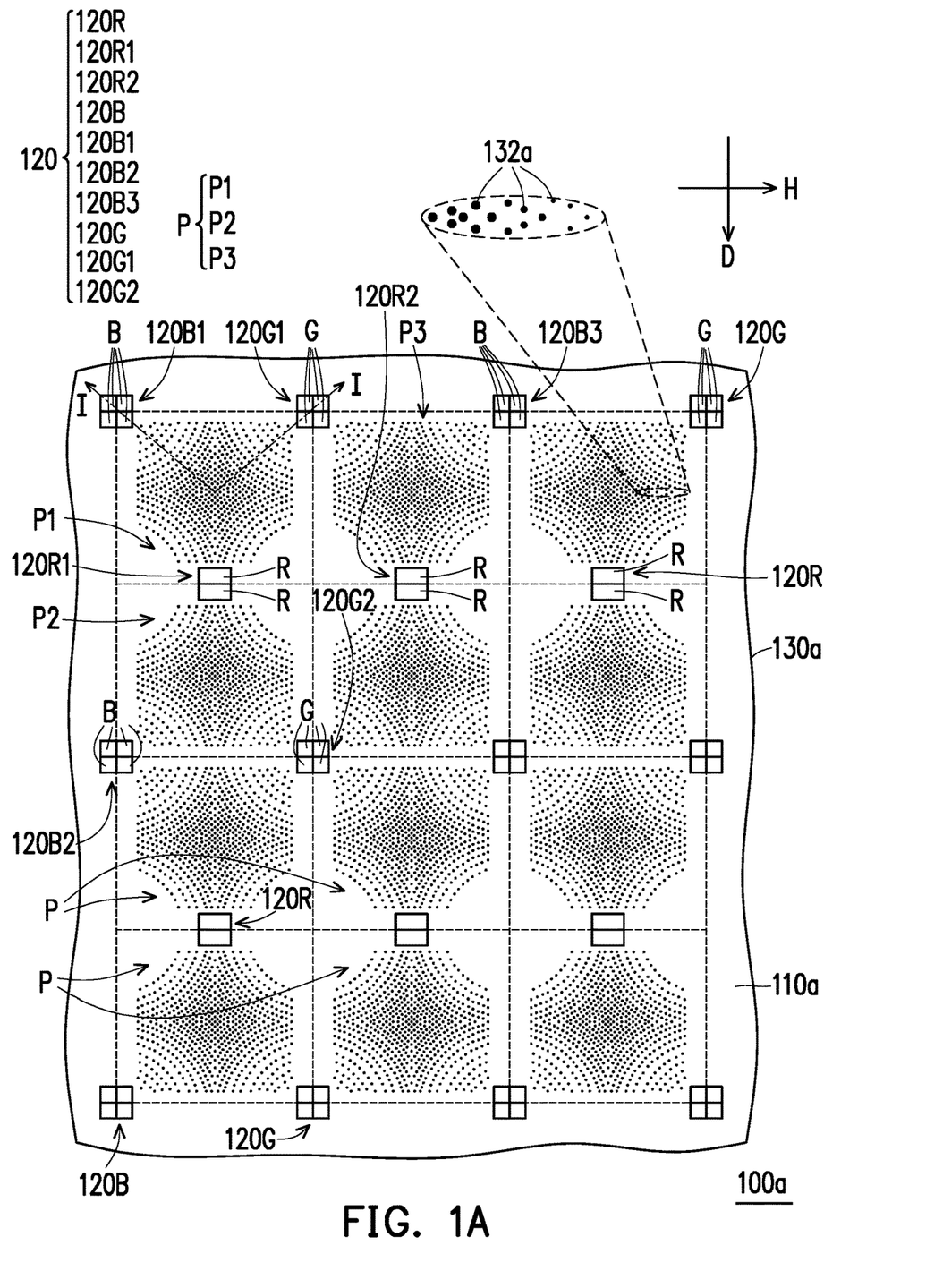
FIG. 1A illustrates a schematic perspective view of a micro light-emitting device display apparatus according to an embodiment of the invention.
Figure 1B:
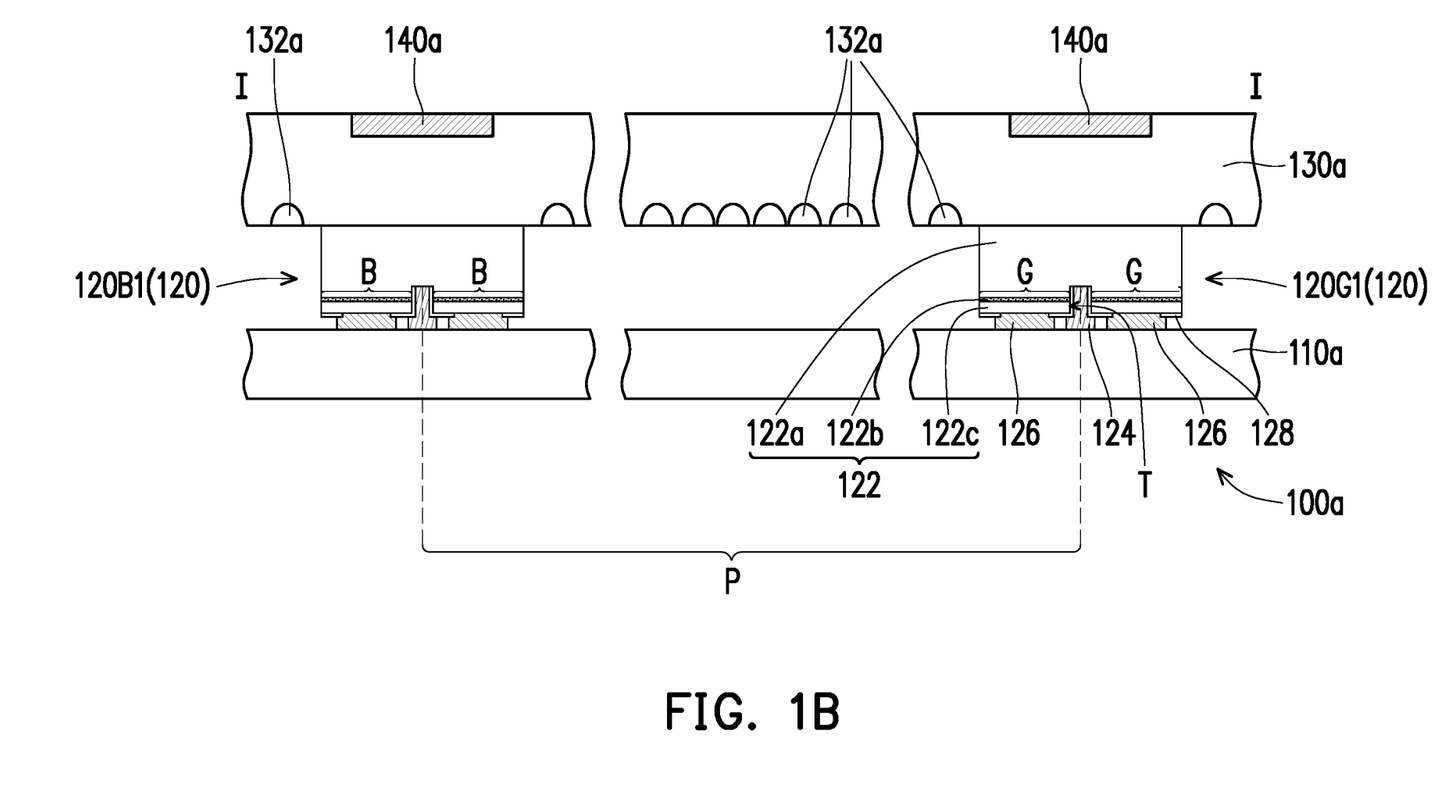
FIG. 1B illustrates a schematic cross-sectional view taken along line I-I of FIG. 1A.

FIG. 1A illustrates a schematic perspective view of a micro light-emitting device display apparatus according to an embodiment of the invention. FIG. 1B illustrates a schematic cross-sectional view taken along line I-I of FIG. 1A. For the sake of clarity, some dot patterns are omitted in FIG. 1B. Referring to FIG. 1A and FIG. 1B at the same time, in the present embodiment, a micro light-emitting device display apparatus 100a includes a driving substrate 110a and a plurality of micro light-emitting devices 120. Herein, the micro light-emitting device display apparatus 100a is, for example, a micro-LED display. The micro-LED display generally further includes other components, such as a central control processor, a touch apparatus, a battery, and the like. The micro-LED display is, for example, a television, a tablet computer, a telephone, a notebook computer, a computer screen, a digital camera, a handheld game device, a multimedia display, a car display, or a large-area electronic signboard, but the invention is not limited thereto.

The driving substrate 110a of the present embodiment has a plurality of pixel regions P arranged in a matrix. The pixel regions P are divided into a first pixel region P1 and a second pixel region P2 adjacent to each other on a vertical axis D, and are divided into the first pixel region P1 and a third pixel region P3 adjacent to each other on a horizontal axis H, but the invention is not limited thereto. Herein, the driving substrate 110a includes, for example but not limited to, a complementary metal oxide semiconductor (CMOS) substrate, a liquid crystal on silicon (LCOS) substrate, a thin film transistor (TFT) substrate, or other substrates having operating circuits.

The micro light-emitting devices 120 are disposed on the driving substrate 110a and are electrically connected to the driving substrate 110a. The micro light-emitting devices 120 include a plurality of first micro light-emitting devices 120B emitting a blue light, a plurality of second micro light-emitting devices 120G emitting a green light, and a plurality of third micro light-emitting devices 120R emitting a red light. The first micro light-emitting devices 120B and the second micro light-emitting devices 120G are arranged in a staggered manner on any horizontal axis H, and the third micro light-emitting devices 120R are arranged on another horizontal axis (H axis).

More specifically, in the present embodiment, each of the first micro light-emitting devices 120B is bonded to the driving substrate 110a and has a plurality of first light-emitting regions B independently controlled. The independent control here means that each of the first micro light-emitting devices 120B is completely transferred and bonded to the driving substrate 110a, and the driving substrate 110a can respectively control each of the first light-emitting regions B of each first micro light-emitting device 120B to present different brightness. In other words, the magnitude of the current passing through each of the first light-emitting regions B of each first micro light-emitting device 120B can be independently controlled.

Similarly, each of the second micro light-emitting devices 120G is bonded to the driving substrate 110a and has a plurality of second light-emitting regions G independently controlled. Each of the third micro light-emitting devices 120R is bonded to the driving substrate 110a and has a plurality of third light-emitting regions R independently controlled. In particular, a first light-emitting region B of a first micro light-emitting device 120B1, a second light-emitting region G of a second micro light-emitting device 120G1 adjacent to the first micro light-emitting device 120B1, and a third light-emitting region R of a third micro light-emitting device 120R1 are located in the first pixel region P1 to serve as a light-emitting source of the first pixel region P1. For the second pixel region P2 adjacent to the first pixel region P1, another third light-emitting region R of the same third micro light-emitting device 120R1, a first light-emitting region B of another first micro light-emitting device 120B2, and a second light-emitting region G of another second micro light-emitting device 120G2 serve as a light-emitting source. That is to say, each of the third micro light-emitting devices 120R in the present embodiment is located between the first pixel region P1 and the second pixel region P2 vertically adjacent to each other, and two third light-emitting regions R that independently control light emitting are used to correspond to the first pixel region P1 and the second pixel region P2 vertically adjacent to each other respectively. Furthermore, for the third pixel region P3 horizontally adjacent to the first pixel region P1, another second light-emitting region G of the same second micro light-emitting device 120G1, a first light-emitting region B of another first micro light-emitting device 120B3, and a third light-emitting region R of another third micro light-emitting device 120R2 serve as a light-emitting source. That is to say, in the present embodiment, each of the micro light-emitting devices 120 corresponds to at least two or more pixel regions P. Herein, the number of the first micro light-emitting devices 120B, the number of the second micro light-emitting devices 120G, and the number of the third micro light-emitting devices 120R are less than the number of the pixel regions P, respectively.

Furthermore, in each pixel region P, the first light-emitting region B of the first micro light-emitting device 120B and the second light-emitting region G of the second micro light-emitting device 120G are located at two ends of the same side of each pixel region P respectively, and the third light-emitting region R of the third micro light-emitting device 120R is located in the center of another side opposite to the side. Herein, each of the first micro light-emitting devices 120B has four first light-emitting regions B, and the four first light-emitting regions B are located in four pixel regions P respectively. Similarly, each of the second micro light-emitting devices 120G has four second light-emitting regions G, and the four second light-emitting regions G are located in four pixel regions P respectively. Each of the third micro light-emitting devices 120R has two third light-emitting regions R, and the two third light-emitting regions R are located in two pixel regions P respectively. In other words, each of the micro light-emitting devices 120 of the present embodiment can be located in a plurality of pixel regions P. Preferably, an area of each of the third light-emitting regions R is greater than an area of each of the first light-emitting regions B and an area of each of the second light-emitting regions G.

It should be noted that the "micro" light-emitting devices 120 used herein are light-emitting devices with a length size ranging from 1 μm to 100 μm. In some embodiments, the micro light-emitting devices 120 may have a maximum length of 30 μm or 15 μm. In some embodiments, the micro light-emitting devices 120 may have a height of less than 10 μm, or even 5 μm. However, it should be understood that the embodiments of the invention are not necessarily limited thereto, and the aspects of some embodiments may be applied to larger and perhaps smaller scales.

Referring to FIG. 1B again, in the present embodiment, each of the micro light-emitting devices 120 includes an epitaxial structure layer 122, a first electrode 124, and a plurality of second electrodes 126. The epitaxial structure layer 122 includes a first type semiconductor layer 122a, a plurality of second type semiconductor layers 122c spaced apart, and a plurality of light-emitting layers 122b spaced apart and connected to the first type semiconductor layer 122a. The light-emitting layers 122b are located between the first type semiconductor layer 122a and the second type semiconductor layers 122c. In this embodiment, there are four light-emitting layers 122b connected to one first type semiconductor layer 122a and four second type semiconductor layers 122c connected to the four light-emitting layers 122b. The first electrode 124 is electrically connected to the first type semiconductor layer 122a. The second electrodes 126 are spaced apart and are electrically connected to the second type semiconductor layers 122c. Herein, the first electrode 124 and the second electrodes 126 are located on the same side of the epitaxial structure layer 122. That is to say, the micro light-emitting devices 120 of the present embodiment are embodied as horizontal micro light-emitting devices. The epitaxial structure layer 122 has a trench T, and the trench T separates the light-emitting layers 122b and the second type semiconductor layers 122c. The first electrode 124 is electrically connected to the first type semiconductor layer 122a through the trench T.

Besides, each of the micro light-emitting devices 120 of the present embodiment includes an insulating layer 128, located between the first electrode 124 and the light-emitting layers 122*b* and between the first electrode 124 and the second type semiconductor layers 122*c* to electrically insulate the first electrode 124 and the light-emitting layers 122*b*, and to electrically insulate the first electrode 124 and the second type semiconductor layers 122*c* to avoid short circuit.

In addition, the micro light-emitting device display apparatus 100*a* of the present embodiment may further include a light guide plate 130*a* and a plurality of reflective layers 140*a*. The light guide plate 130*a* is disposed on a side of the epitaxial structure layer 122 relatively far away from the first electrode 124 and the second electrodes 126. The reflective layers 140*a* are disposed in the light guide plate 130*a*, and correspond to the micro light-emitting devices 120. Herein, the micro light-emitting devices 120 are located between the light guide plate 130*a* and the driving substrate 110*a*. In another embodiment, a light shielding layer may be disposed at the position of the reflective layer 140*a* to replace the reflective layer 140*a*, which still falls within the scope of protection of the invention.

Referring to FIG. 1A and FIG. 1B at the same time again, the light guide plate 130*a* of the present embodiment has a plurality of dot patterns 132*a*. Each of the dot patterns 132*a* is, for example but not limited to, a groove pattern. The reflective layers 140*a* and the dot patterns 132*a* are disposed on two opposite side surfaces of the light guide plate 130*a* respectively. The dot patterns 132*a* are closer to the driving substrate 110*a* relative to the reflective layers 140*a*. After light emitted by the micro light-emitting devices 120 enters the light guide plate 130*a*, the light will be scattered or refracted by the dot patterns 132*a*. Preferably, in an embodiment, a density of the dot patterns 132*a* may gradually decrease in a direction from being far away from the micro light-emitting devices 120 to being close to the micro light-emitting devices 120. In another embodiment, a diameter of the dot patterns 132*a* may gradually decrease in the direction from being far away from the micro light-emitting devices 120 to being close to the micro light-emitting devices 120. With the above arrangement, light emitted by the micro light-emitting devices 120 may be evenly guided out.

In short, in the design of the micro light-emitting device display apparatus 100*a* of the present embodiment, a first light-emitting region B of a first micro light-emitting device 120B1, a second light-emitting region G of a second micro light-emitting device 120G1, and a third light-emitting region R of a third micro light-emitting device 120R are located in a first pixel region P1 to serve as a light-emitting source of the first pixel region P1. For a second pixel region P2 vertically adjacent to the first pixel region P1, another third light-emitting region R of the same third micro light-emitting device 120R1, a first light-emitting region B of another first micro light-emitting device 120B2, and a second light-emitting region G of another second micro light-emitting device 120G2 serve as a light-emitting source of the second pixel region P2. For a third pixel region P3 horizontally adjacent to the first pixel region P1, another second light-emitting region G of the same second micro light-emitting device 120G1, a first light-emitting region B of another first micro light-emitting device 120B3, and a third light-emitting region R of another third micro light-emitting device 120R2 serve as a light-emitting source of the third pixel region P3. That is to say, a micro light-emitting device 120 is located in a plurality of pixel regions P, so that the number of micro light-emitting devices 120 used can be reduced, and the production cost can be effectively reduced. In addition, since the present invention uses a micro light-emitting device 120 as a light-emitting source, the micro light-emitting device display apparatus 100*a* of the present embodiment can achieve the effects of high resolution, reduced display power consumption, and energy saving.

It should be noted here that the following embodiments follow the device numbers and partial contents of the foregoing embodiments, where the same reference numbers are used to indicate the same or similar devices, and the description of the same technical contents is omitted. For the description of the omitted parts, reference may be made to the foregoing embodiments, and the following embodiments will not be repeated.

Figure 2:
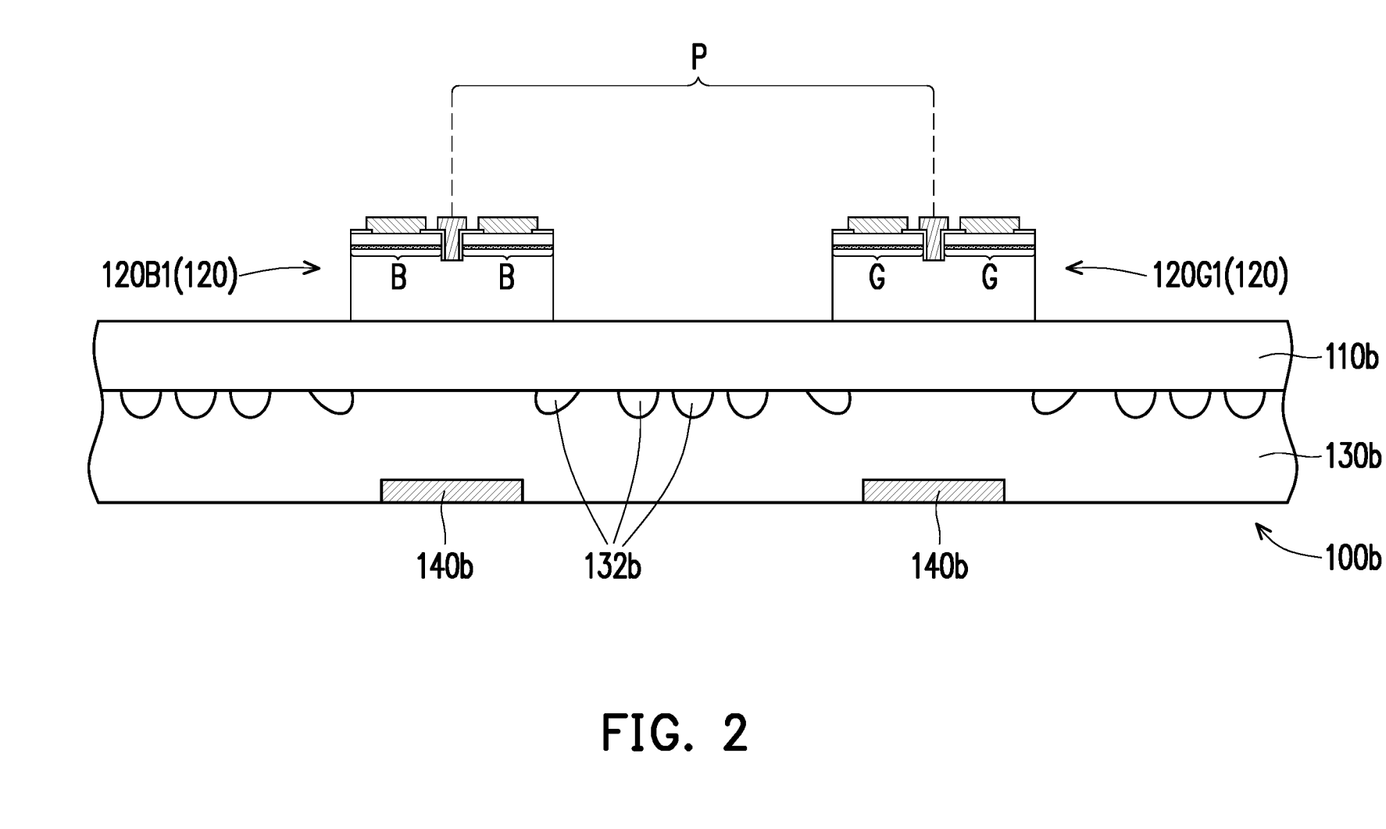
FIG. 2 illustrates a schematic cross-sectional view of a micro light-emitting device display apparatus according to another embodiment of the invention.

FIG. 2 illustrates a schematic cross-sectional view of a micro light-emitting device display apparatus according to another embodiment of the invention. Referring to FIG. 1B and FIG. 2 at the same time, a micro light-emitting device display apparatus 100*b* of the present embodiment is similar to the micro light-emitting device display apparatus 100*a* of FIG. 1B. The difference between them is that a driving substrate 110*b* of the present embodiment is located between the micro light-emitting device 120 and a light guide plate 130*b*. Besides, reflective layers 140*b* and dot patterns 132*b* of the present embodiment are disposed on two opposite side surfaces of the light guide plate 130*b* respectively. The dot patterns 132*b* are closer to the driving substrate 110*b* relative to the reflective layers 140*b*. Herein, each of the dot patterns 132*b* is embodied as a combination of an oblique concave pattern and a groove pattern. The oblique concave pattern may assist in enhancing a light guide effect, so that each light-emitting region of the micro light-emitting device 120 may provide a light source to the corresponding pixel region, and can increase the light extraction efficiency.

Figure 3:
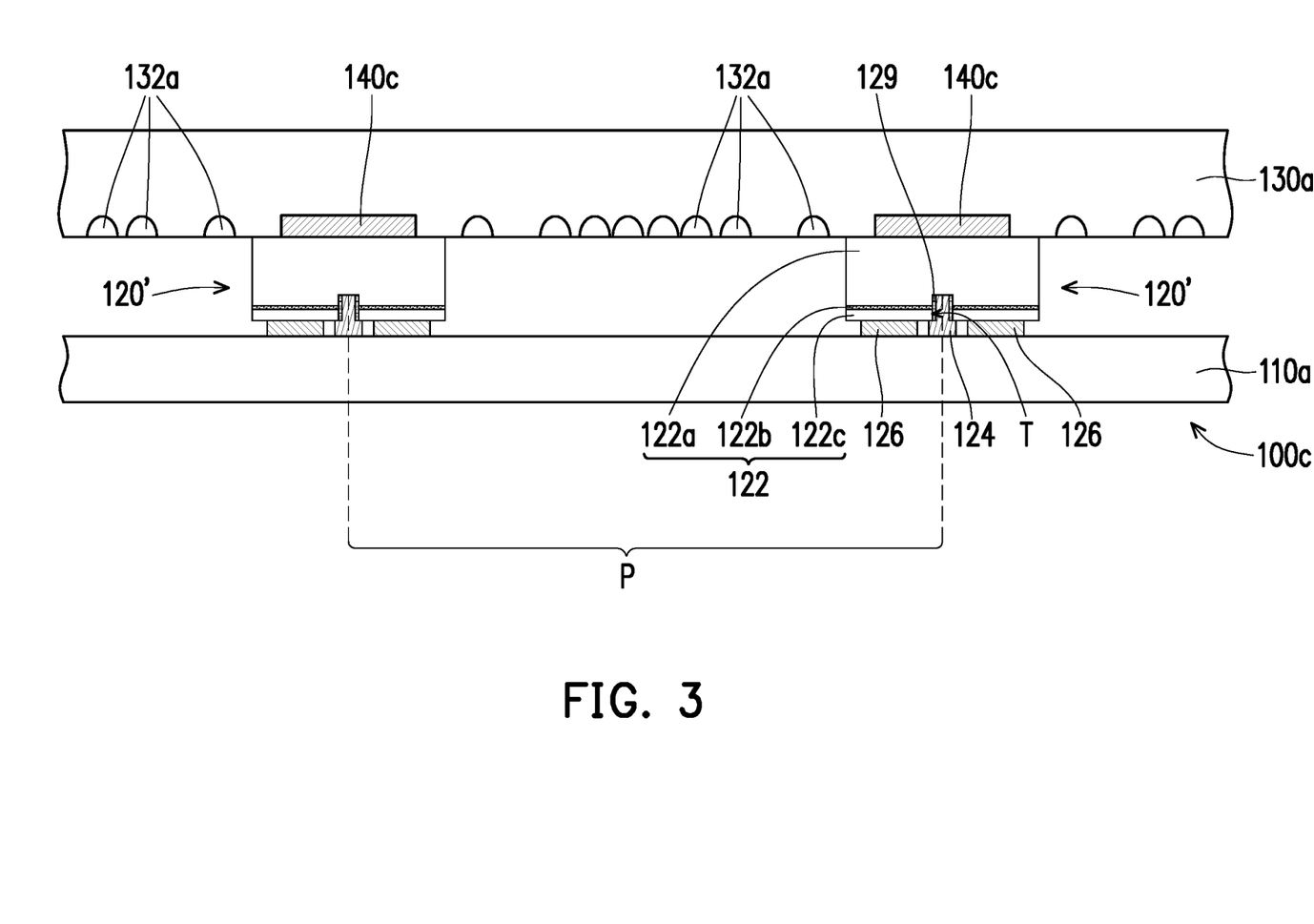
FIG. 3 illustrates a schematic cross-sectional view of a micro light-emitting device display apparatus according to another embodiment of the invention.

FIG. 3 illustrates a schematic cross-sectional view of a micro light-emitting device display apparatus according to another embodiment of the invention. Referring to FIG. 1B and FIG. 3 at the same time, a micro light-emitting device display apparatus 100*c* of the present embodiment is similar to the micro light-emitting device display apparatus 100*a* of FIG. 1B. The difference between them is that reflective layers 140*c* and the dot patterns 132*a* of the present embodiment are disposed on the same side of the light guide plate 130*a*, and the trench T of each micro light-emitting device 120' is provided with a light barrier layer 129, located between the first electrode 124 and the light-emitting layers 122*b* and between the first electrode 124 and the second type semiconductor layers 122*c*. Herein, the light barrier layer 129 may, for example, have the characteristic of reflectivity, scattering, or light absorption, to prevent light emitted by two adjacent light-emitting regions from interfering with each other, and to reduce the problem of light leakage.

Figure 4:
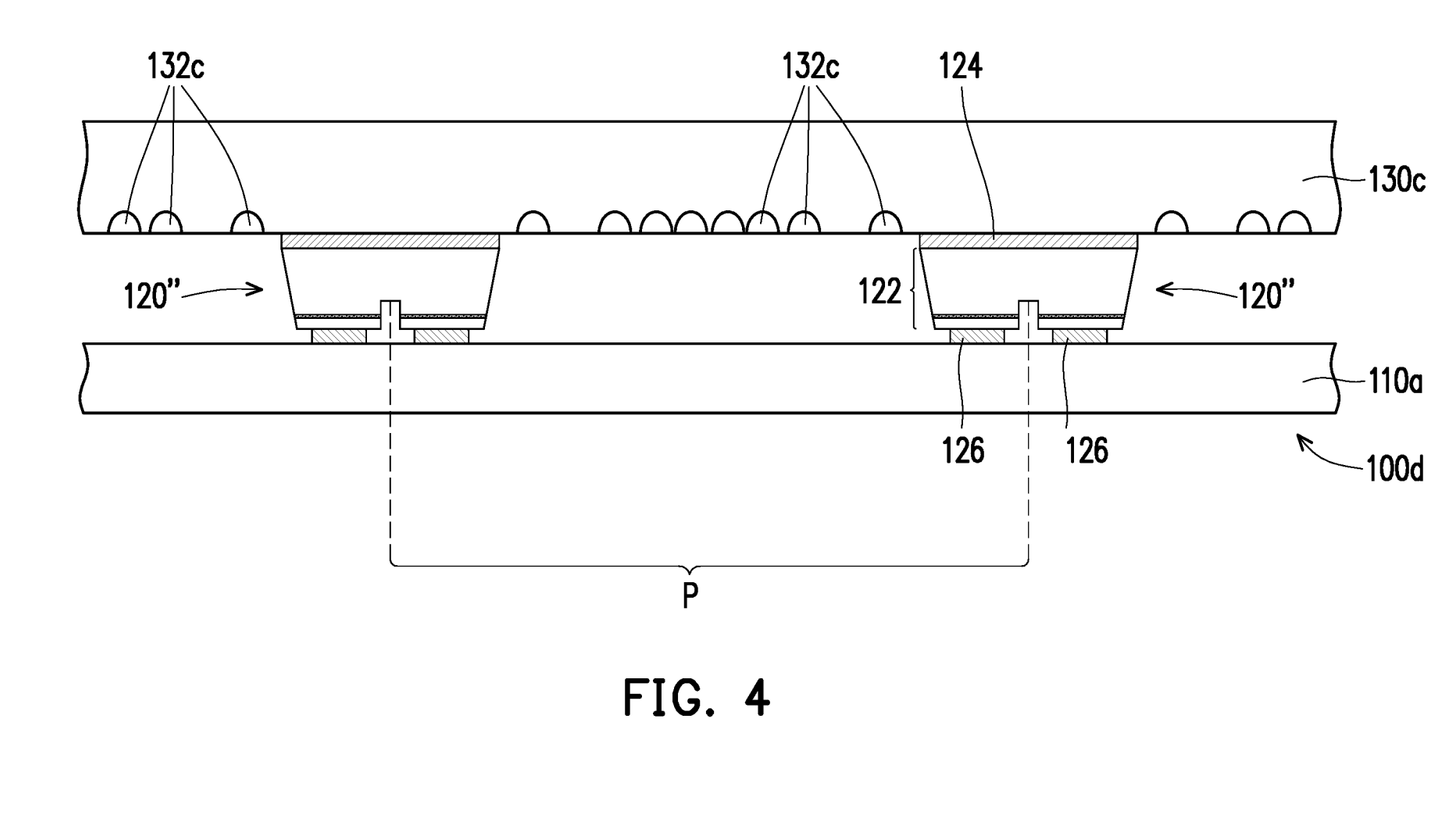
FIG. 4 illustrates a schematic cross-sectional view of a micro light-emitting device display apparatus according to another embodiment of the invention.

FIG. 4 illustrates a schematic cross-sectional view of a micro light-emitting device display apparatus according to yet another embodiment of the invention. Referring to FIG. 1B and FIG. 4 at the same time, a micro light-emitting device display apparatus 100*d* of the present embodiment is similar to the micro light-emitting device display apparatus 100*a* of FIG. 1B. The difference between them is that the first electrode 124 and the second electrodes 126 of each micro light-emitting device 120" of the present embodiment are located on two opposite sides of the epitaxial structure layer 122 respectively. That is to say, the micro light-emitting devices 120" of the present embodiment are embodied as vertical micro light-emitting devices. In addition, since reflective layers 140*a* are not provided in the present embodiment, only dot patterns 132*c* are provided in a light guide plate 130*c*. In the present embodiment, the first electrode 124 and the second electrodes 126 may be made of a highly reflective conductive material such as metal or alloy, to reflect light to a side wall of the micro light-emitting devices 120" and guide the light out.

Figure 5:
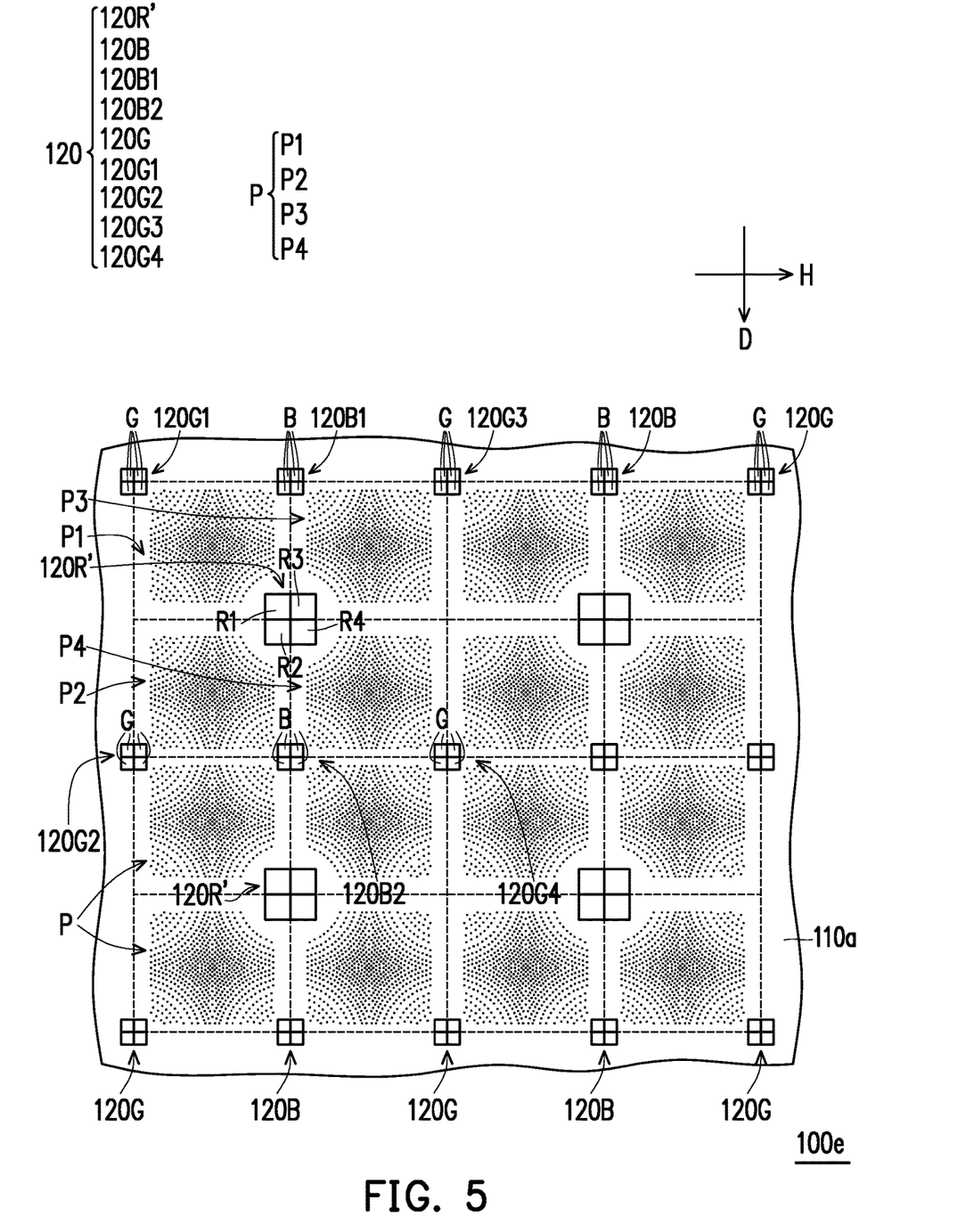
FIG. 5 illustrates a schematic perspective view of a micro light-emitting device display apparatus according to another embodiment of the invention.

FIG. 5 illustrates a schematic perspective view of a micro light-emitting device display apparatus according to another embodiment of the invention. Referring to FIG. 1A and FIG. 5 at the same time, a micro light-emitting device display apparatus 100e of the present embodiment is similar to the micro light-emitting device display apparatus 100a of FIG. 1A. The difference between them is that in the present embodiment, the pixel regions P are divided into the first pixel region P1 and the second pixel region P2 vertically adjacent to each other on the vertical axis D, and are divided into the third pixel region P3 horizontally adjacent to the first pixel region P1 and a fourth pixel region P4 horizontally adjacent to the second pixel region P2 on the horizontal axis H. The first micro light-emitting devices 120B and the second micro light-emitting devices 120G are arranged in a staggered manner on any horizontal axis H. Third micro light-emitting devices 120W are arranged on another horizontal axis H and are arranged as the first micro light-emitting devices 120B in a staggered manner on the same vertical axis D.

In detail, a second light-emitting region G of a second micro light-emitting device 120G1, a first light-emitting region B of a first micro light-emitting device 120B1 adjacent to the second micro light-emitting device 120G1, and a third light-emitting region R1 of a third micro light-emitting device 120R' are located in the first pixel region P1 to serve as a light-emitting source of the first pixel region P1. In the second pixel region P2, another third light-emitting region R2 of the same third micro light-emitting device 120R', a second light-emitting region G of another second micro light-emitting device 120G2, and a first light-emitting region B of another first micro light-emitting device 120B2 serve as a light-emitting source. In the third pixel region P3, another third light-emitting region R3 of the same third micro light-emitting device 120W, another first light-emitting region B of the same first micro light-emitting device 120B1, and a second light-emitting region G of another second micro light-emitting device 120G3 serve as a light-emitting source. In the fourth pixel region P4, the other third light-emitting region R4 of the same third micro light-emitting device 120R', another first light-emitting region B of the same first micro light-emitting device 120B2, and a second light-emitting region G of another second micro light-emitting device 120G4 serve as a light-emitting source. That is to say, the third light-emitting regions R1, R2, R3, and R4 of each third micro light-emitting device 120R' in the present embodiment are located in the first pixel region P1, the second pixel region P2, the third pixel region P3, and the fourth pixel region P4 adjacent to each other respectively. In other words, each of the micro light-emitting devices 120 may be located in a plurality of pixel regions P. Preferably, an area of each of the third light-emitting regions R1, R2, R3, and R4 is greater than an area of each of the first light-emitting regions B and an area of each of the second light-emitting regions G.

Besides, in the first pixel region P1, the first light-emitting region B of the first micro light-emitting device 120B1 and the second light-emitting region G of the second micro light-emitting device 120G1 are located at two ends of the same side of the first pixel region P1 respectively, and the third light-emitting region R1 of the third micro light-emitting device 120R' is located at an end of another side opposite to the side, and corresponds to the first light-emitting region B of the first micro light-emitting device 120B1. In the second pixel region P2, the first light-emitting region B of the first micro light-emitting device 120B2 and the second light-emitting region G of the second micro light-emitting device 120G2 are located at two ends of the same side of the second pixel region P2 respectively, and another third light-emitting region R2 of the third micro light-emitting device 120R' is located at an end of another side opposite to the side, and corresponds to the first light-emitting region B of the first micro light-emitting device 120B2. In the third pixel region P3, another first light-emitting region B of the first micro light-emitting device 120B1 and the second light-emitting region G of the second micro light-emitting device 120G3 are located at two ends of the same side of the third pixel region P3 respectively, and another third light-emitting region R3 of the third micro light-emitting device 120W is located at an end of another side opposite to the side, and corresponds to another first light-emitting region B of the first micro light-emitting device 120B1. In the fourth pixel region P4, another first light-emitting region B of the first micro light-emitting device 120B2 and the second light-emitting region G of the second micro light-emitting device 120G4 are located at two ends of the same side of the fourth pixel region P4 respectively, and the other third light-emitting region R4 of the third micro light-emitting device 120R' is located at an end of another side opposite to the side, and corresponds to another first light-emitting region B of the first micro light-emitting device 120B2.

In short, in the design of the micro light-emitting device display apparatus 100e of the present embodiment, a micro light-emitting device 120 is located in a plurality of pixel regions P, so that the number of micro light-emitting devices 120 used can be reduced, and the production cost can be effectively reduced. In addition, since the present invention uses a micro light-emitting device 120 as a light-emitting source, the micro light-emitting device display apparatus 100e of the present embodiment can achieve the effects of high resolution, reduced display power consumption, and energy saving.

Figure 6:
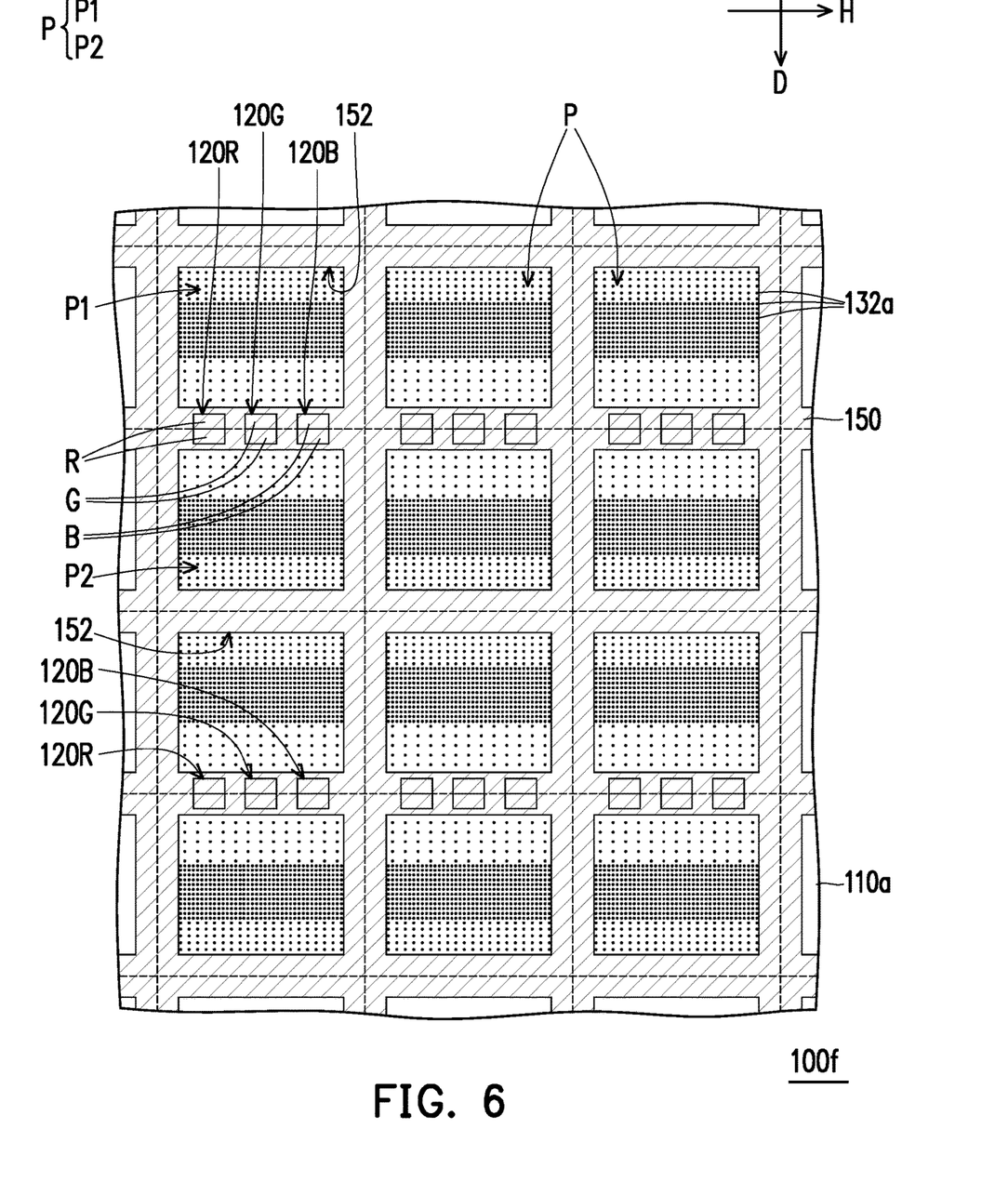
FIG. 6 illustrates a schematic perspective view of a micro light-emitting device display apparatus according to another embodiment of the invention.

FIG. 6 illustrates a schematic perspective view of a micro light-emitting device display apparatus according to another embodiment of the invention. For convenience and clear description, FIG. 6 is a perspective view, in which the first micro light-emitting device 120B, the second micro light-emitting device 120G, and the third micro light-emitting device 120R are substantially located under the light shielding layer 150.

Referring to FIG. 1A and FIG. 6 at the same time, a micro light-emitting device display apparatus 100f of the present embodiment is similar to the micro light-emitting device display apparatus 100a of FIG. 1A. The difference between them is that the micro light-emitting device display apparatus 100f of the present embodiment further includes a light shielding layer 150. The light shielding layer 150 has a plurality of pixel openings 152 arranged in a matrix to define the pixel region P on the driving substrate 110a. In addition, in the present embodiment, each of the first micro light-emitting devices 120B, each of the second micro light-emitting devices 120G and each of the third micro light-emitting devices 120R are located between the first pixel region P1 and the second pixel region P2 vertically adjacent to each other, and two first light-emitting regions B, two second light-emitting regions G and two third light-emitting regions R that independently control light emitting are used to correspond to the first pixel region P1 and the second pixel region P2 vertically adjacent to each other respectively.

Figure 7:
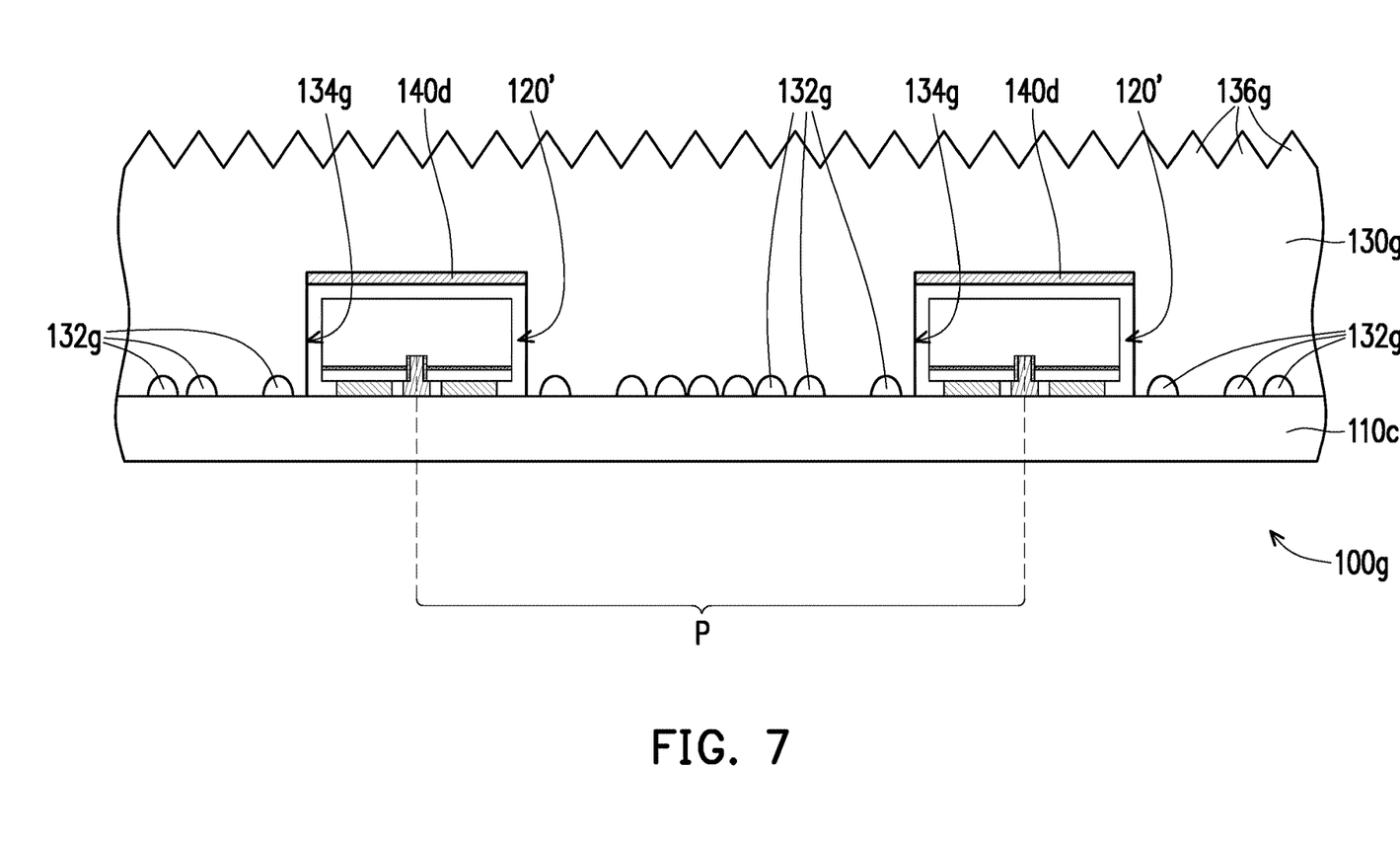
FIG. 7 illustrates a schematic cross-sectional view of a micro light-emitting device display apparatus according to another embodiment of the invention.

FIG. 7 illustrates a schematic cross-sectional view of a micro light-emitting device display apparatus according to another embodiment of the invention. Referring to FIG. 1B and FIG. 7 at the same time, a micro light-emitting device display apparatus 100g of the present embodiment is similar to the micro light-emitting device display apparatus 100a of FIG. 1B. The difference between them is that a light guide plate 130g of the present embodiment further includes a groove 134g and a prism structure 136g. In detail, the light guide plate 130g is directly disposed on a driving substrate 110c, and the groove 134g extends from a side opposite to the driving substrate 110c to another side far away from the driving substrate 110c. A micro light-emitting device 120' is disposed on the driving substrate 110c and is correspondingly located in the groove 134g. A dot pattern 132g and the prism structure 136g are located on two opposite sides of the light guide plate 130g respectively. The prism structure 136g is located on the another side of the light guide plate 130g relatively far away from the driving substrate 110c. In addition, the micro light-emitting device display apparatus 100g of the present embodiment further includes a reflective layer 140d. The reflective layer 140d is located on a bottom surface of the groove 134g. Through the design of the light guide plate 130g and the reflective layer 140d, the light emitting efficiency of the micro light-emitting device 120' can be increased.

To sum up, based on the foregoing, in the design of the micro light-emitting device display apparatus of the invention, a first light-emitting region of a first micro light-emitting device, a second light-emitting region of a second micro light-emitting device, and a third light-emitting region of a third micro light-emitting device are located in a first pixel region. A first light-emitting region of another first micro light-emitting device, a second light-emitting region of another second micro light-emitting device, and another third light-emitting region of the third micro light-emitting device are located in a second pixel region adjacent to the first pixel region. That is to say, a micro light-emitting device is located in a plurality of pixel regions, so that the number of micro light-emitting devices used can be reduced, and the production cost can be effectively reduced. In addition, since the present invention uses a micro light-emitting device as a light-emitting source, the micro light-emitting device display apparatus of the invention can achieve the effects of high resolution, reduced display power consumption, and energy saving.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A micro light-emitting device display apparatus, comprising:
    a driving substrate, comprising a plurality of pixel regions, wherein the plurality of pixel regions are divided into at least one first pixel region and at least one second pixel region adjacent to each other on a vertical axis; and
    a plurality of micro light-emitting devices, disposed on the driving substrate and electrically connected to the driving substrate, the plurality of micro light-emitting devices comprising:
        a plurality of first micro light-emitting devices, each of the plurality of first micro light-emitting devices bonded to the driving substrate and comprising a plurality of first light-emitting regions independently controlled;
        a plurality of second micro light-emitting devices, each of the plurality of second micro light-emitting devices bonded to the driving substrate and comprising a plurality of second light-emitting regions independently controlled; and
        a plurality of third micro light-emitting devices, each of the plurality of third micro light-emitting devices bonded to the driving substrate and comprising a plurality of third light-emitting regions independently controlled, wherein one of the plurality of first light-emitting regions of one of the plurality of first micro light-emitting devices, one of the plurality of second light-emitting regions of one of the plurality of second micro light-emitting devices, and one of the plurality of third light-emitting regions of one of the plurality of third micro light-emitting devices are located in the first pixel region, and one of the plurality of first light-emitting regions of another of the plurality of first micro light-emitting devices, one of the plurality of second light-emitting regions of another of the plurality of second micro light-emitting devices, and another of the plurality of third light-emitting regions of the one of the plurality of third micro light-emitting devices are located in the second pixel region,
    wherein each of the plurality of micro light-emitting devices comprises:
        an epitaxial structure layer, comprising a first type semiconductor layer, a plurality of second type semiconductor layers spaced apart, and a plurality of light-emitting layers spaced apart and connected to the first type semiconductor layer, the plurality of light-emitting layers being located between the first type semiconductor layer and the plurality of second type semiconductor layers;
        a first electrode, electrically connected to the first type semiconductor layer; and
        a plurality of second electrodes, spaced apart and electrically connected to the plurality of second type semiconductor layers.

2. The micro light-emitting device display apparatus according to claim 1, wherein the number of the plurality of first micro light-emitting devices, the number of the plurality of second micro light-emitting devices, and the number of the plurality of third micro light-emitting devices are less than the number of the plurality of pixel regions, respectively.

3. The micro light-emitting device display apparatus according to claim 2, wherein each of the plurality of first micro light-emitting devices emits a blue light, each of the plurality of second micro light-emitting devices emits a green light, each of the plurality of third micro light-emitting devices emits a red light, and an area of each of the plurality of third light-emitting regions is greater than an area of each of the plurality of first light-emitting regions and an area of each of the plurality of second light-emitting regions.

4. The micro light-emitting device display apparatus according to claim 3, wherein the plurality of first micro light-emitting devices and the plurality of second micro light-emitting devices are arranged in a staggered manner on a horizontal axis.

5. The micro light-emitting device display apparatus according to claim 1, wherein in each of the plurality of pixel regions, one of the plurality of first light-emitting regions of each of the plurality of first micro light-emitting devices and one of the plurality of second light-emitting regions of each of the plurality of second micro light-emitting devices are located at two ends of the same side of each of the plurality of pixel regions respectively, and one of the plurality of third light-emitting regions of each of the plurality of third micro light-emitting devices is located in the center of another side opposite to the side.

6. The micro light-emitting device display apparatus according to claim 5, wherein the plurality of first light-emitting regions of each of the plurality of first micro light-emitting devices are located in four of the plurality of pixel regions respectively, the plurality of second light-emitting regions of each of the plurality of second micro light-emitting devices are located in four of the plurality of pixel regions, and the plurality of third light-emitting regions of each of the plurality of third micro light-emitting devices are located in two of the plurality of pixel regions.

7. The micro light-emitting device display apparatus according to claim 4, wherein in each of the plurality of pixel regions, one of the plurality of first light-emitting regions of each of the plurality of first micro light-emitting devices and one of the plurality of second light-emitting regions of each of the plurality of second micro light-emitting devices are located at two ends of the same side of each of the plurality of pixel regions respectively, one of the plurality of third light-emitting regions of each of the plurality of third micro light-emitting devices is located at an end of another side opposite to the side, and the plurality of first micro light-emitting devices and the plurality of third micro light-emitting devices are arranged in a staggered manner on the vertical axis.

8. The micro light-emitting device display apparatus according to claim 7, wherein the plurality of first light-emitting regions of each of the plurality of first micro light-emitting devices are located in four of the plurality of pixel regions respectively, the plurality of second light-emitting regions of each of the plurality of second micro light-emitting devices are located in four of the plurality of pixel regions, and the plurality of third light-emitting regions of each of the plurality of third micro light-emitting devices are located in four of the plurality of pixel regions.

9. The micro light-emitting device display apparatus according to claim 1, wherein the first electrode and the plurality of second electrodes are located on two opposite sides of the epitaxial structure layer respectively.

10. The micro light-emitting device display apparatus according to claim 1, wherein the first electrode and the plurality of second electrodes are located on the same side of the epitaxial structure layer, the epitaxial structure layer comprises a trench, the trench separates the plurality of light-emitting layers and the plurality of second type semiconductor layers, and the first electrode is electrically connected to the first type semiconductor layer through the trench.

11. The micro light-emitting device display apparatus according to claim 10, further comprising:
a light guide plate, disposed on a side of the epitaxial structure layer relatively far away from the first electrode and the plurality of second electrodes.

12. The micro light-emitting device display apparatus according to claim 11, wherein each of the plurality of micro light-emitting devices further comprises a light barrier layer located between the first electrode and the plurality of light-emitting layers and between the first electrode and the plurality of second type semiconductor layers.

13. The micro light-emitting device display apparatus according to claim 11, further comprising:
a plurality of reflective layers, disposed in the light guide plate, and corresponding to the plurality of micro light-emitting devices.

14. The micro light-emitting device display apparatus according to claim 13, wherein each of the plurality of micro light-emitting devices comprises an insulating layer, located between the first electrode and the plurality of light-emitting layers and between the first electrode and the plurality of second type semiconductor layers to electrically insulate the first electrode and the plurality of light-emitting layers, and to electrically insulate the first electrode and the plurality of second type semiconductor layers.

15. The micro light-emitting device display apparatus according to claim 11, wherein the plurality of micro light-emitting devices are located between the light guide plate and the driving substrate.

16. The micro light-emitting device display apparatus according to claim 11, wherein the driving substrate is located between the plurality of micro light-emitting devices and the light guide plate.

17. The micro light-emitting device display apparatus according to claim 11, wherein the light guide plate comprises a plurality of dot patterns, and a density of the plurality of dot patterns gradually decreases in a direction from being far away from the plurality of micro light-emitting devices to being close to the plurality of micro light-emitting devices.

18. The micro light-emitting device display apparatus according to claim 17, wherein a diameter of the plurality of dot patterns gradually decreases in the direction from being far away from the plurality of micro light-emitting devices to being close to the plurality of micro light-emitting devices.

19. The micro light-emitting device display apparatus according to claim 18, wherein each of the plurality of dot patterns comprises a groove pattern, an oblique concave pattern, or a combination of the above patterns.

* * * * *